US011139102B2

(12) United States Patent
Kneller et al.

(10) Patent No.: US 11,139,102 B2
(45) Date of Patent: Oct. 5, 2021

(54) 52 CUBIC MILLIMETER TRANSFORMER FOR DC-DC CONVERTER DEVICE

(71) Applicant: Murata Manufacturing Co., Ltd., Nagaokakyo (JP)

(72) Inventors: Quinn Kneller, Milton Keynes (GB); Scott Parish, Milton Keynes (GB); Mark Moffat, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/703,086

(22) Filed: Sep. 13, 2017

(65) Prior Publication Data

US 2018/0076704 A1    Mar. 15, 2018

(30) Foreign Application Priority Data

Sep. 15, 2016 (GB) .................................. 1615743

(51) Int. Cl.
*H01F 27/28*    (2006.01)

(52) U.S. Cl.
CPC ..... *H01F 27/2804* (2013.01); *H01F 27/2895* (2013.01); *H01F 2027/2809* (2013.01); *H01F 2027/2819* (2013.01)

(58) Field of Classification Search
CPC ..... H01F 2027/2804; H01F 2027/2809; H01F 2027/2814; H01F 2027/2819
See application file for complete search history.

(56) References Cited

U.S. PATENT DOCUMENTS

| 4,928,314 | A | * | 5/1990 | Grandfield | ........... H03B 5/1203 331/109 |
| 5,475,358 | A | * | 12/1995 | Kotani | ................... H01C 1/022 338/118 |
| 6,580,126 | B1 | | 6/2003 | Suzumura et al. | |

(Continued)

FOREIGN PATENT DOCUMENTS

GB    2535765 A    8/2016

OTHER PUBLICATIONS

Pei-Si Wu, Chi-Hsueh Wang, Tian-Wei Huang and Huei Wang, "Compact and broad-band millimeter-wave monolithic transformer balanced mixers," in IEEE Transactions on Microwave Theory and Techniques, vol. 53, No. 10, pp. 3106-3114, Oct. 2005.*

(Continued)

*Primary Examiner* — Peter M Novak
(74) *Attorney, Agent, or Firm* — Keating & Bennett, LLP

(57) ABSTRACT

A DC-DC converter includes an insulating substrate; a magnetic core embedded in the insulating substrate, the magnetic core having non-zero x, y and z dimensions of less than or equal to about 5.4 mm by about 5.4 mm by about 1.8 mm; separate primary and secondary transformer windings surrounding first and second regions of the magnetic core; and a control circuit including: an oscillator; a drive circuit coupled to the oscillator; and one or more switches coupled to the drive circuit; the drive circuit providing a switching signal to the one or more switches and energizing the one or more switches to provide a drive voltage to the primary transformer winding. The one or more switches are Field Effect Transistors implemented in a Silicon-on-Insulator configuration or as a Silicon-on-Sapphire configuration.

14 Claims, 6 Drawing Sheets

(56) References Cited

U.S. PATENT DOCUMENTS

| | | | | |
|---|---|---|---|---|
| 2009/0206059 | A1* | 8/2009 | Kiko | H02J 3/14 |
| | | | | 218/143 |
| 2011/0108317 | A1* | 5/2011 | Harrison | H01F 17/0033 |
| | | | | 174/266 |
| 2012/0126926 | A1* | 5/2012 | Kroener | H01F 27/2804 |
| | | | | 336/199 |
| 2014/0116758 | A1* | 5/2014 | Li | H05K 1/165 |
| | | | | 174/255 |
| 2015/0101854 | A1* | 4/2015 | Lee | H01F 27/2804 |
| | | | | 174/260 |
| 2015/0365003 | A1* | 12/2015 | Sadwick | H02M 3/28 |
| | | | | 363/21.01 |
| 2016/0049235 | A1 | 2/2016 | Parish et al. | |
| 2016/0049236 | A1 | 2/2016 | Kneller et al. | |
| 2016/0111965 | A1 | 4/2016 | Wang et al. | |
| 2017/0149356 | A1* | 5/2017 | Biglarbegian | H01F 17/0013 |

OTHER PUBLICATIONS

N. Wang, R. Miftakhutdinov, S. Kulkarni and C. O'Mathuna, "High Efficiency on Si-Integrated Microtransformers for Isolated Power Conversion Applications," in IEEE Transactions on Power Electronics, vol. 30, No. 10, pp. 5746-5754, Oct. 2015. (Year: 2015).*

E. Macrelli et al., "Modeling, Design, and Fabrication of High-Inductance Bond Wire Microtransformers With Toroidal Ferrite Core," in IEEE Transactions on Power Electronics, vol. 30, No. 10, pp. 5724-5737, Oct. 2015, doi: 10.1109/TPEL.2014.2370814. (Year: 2015).*

O. Dezuari, S.E. Gilbert, E. Belloy, M.A.M. Gijs, "High inductance planar transformers," Sensors and Actuators A: Physical, olume 81, Issues 1-3, (Year: 2000).*

Official Communication issued in corresponding Patent Application No. GB1615743.0, dated Feb. 22, 2017.
Parish et al., "Embedded Magnetic Component Device", U.S. Appl. No. 14/825,327, filed Aug. 13, 2015.
Kneller et al., "Embedded Magnetic Component Device", U.S. Appl. No. 14/825,332, filed Aug. 13, 2015.
Francis, "Embedded Magnetic Component Device", U.S. Appl. No. 14/883,854, filed Oct. 15, 2015.
Wang et al., "Embedded Magnetic Component Transformer Device", U.S. Appl. No. 14/883,855, filed Oct. 15, 2015.
Kneller, "Embedded Magnetic Component Transformer Device", U.S. Appl. No. 14/883,859, filed Oct. 15, 2015.
Kneller, "Embedded Magnetic Component Transformer Device", U.S. Appl. No. 14/883,863, filed Oct. 15, 2015.
Wang et al., "Embedded Magnetic Component Transformer Device", U.S. Appl. No. 14/883,866, filed Oct. 15, 2015.
Kneller et al., "Embedded Magnetgic Component Transformer", U.S. Appl. No. 15/019,240, filed Feb. 9, 2016.
Parish et al., "Embedded Magnetic Component Device", U.S. Appl No. 15/054,412, filed Feb. 26, 2016.
Lloyd, "Embedded Magnetic Component", U.S. Appl. No. 15/049,414, filed Feb. 22, 2016.
Harber, "Embedded Magnetic Component Device", U.S. Appl. No. 15/050,536, filed Feb. 23, 2016.
Kneller et al., "Multi-Tap Winding Design for Embedded Transformer", U.S. Appl. No. 15/498,765, filed Apr. 27, 2017.
Francis, "Power Electronics Device With Improved Isolation Performance", U.S. Appl. No. 15/498,769, filed Apr. 27, 2017.
English translation of Official Communication issued in corresponding Chinese Patent Application No. 201710826520.1, dated Jul. 30, 2020.

* cited by examiner

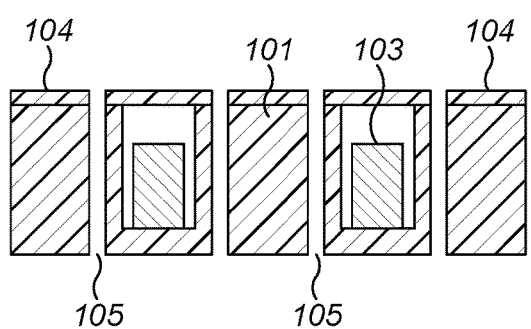
FIG. 1D
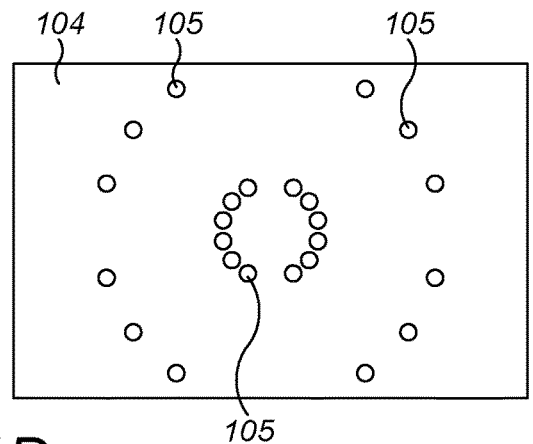
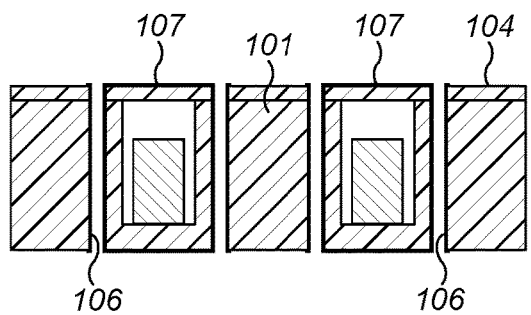
FIG. 1E
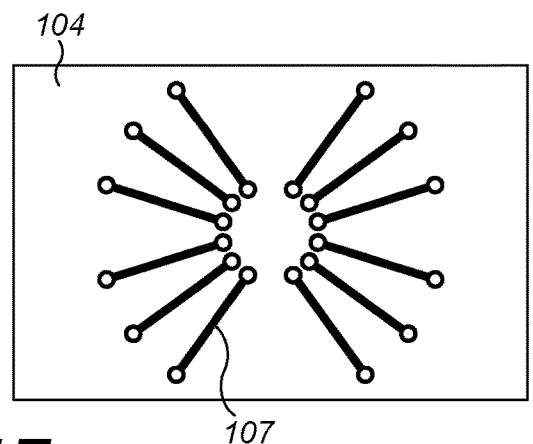
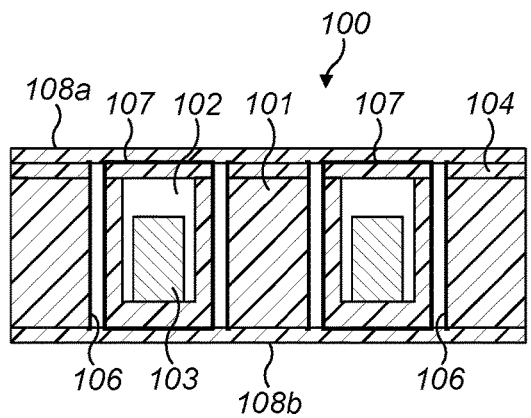
FIG. 1F
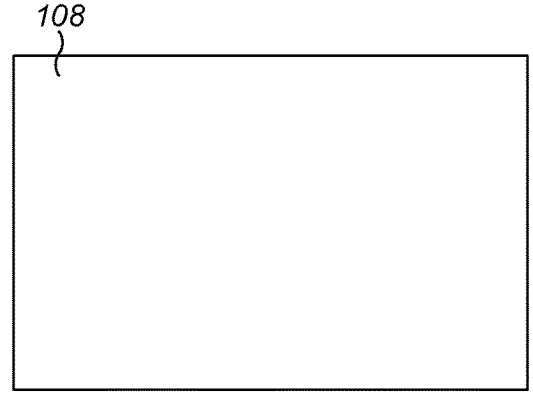

52 CUBIC MILLIMETER TRANSFORMER FOR DC-DC CONVERTER DEVICE

CROSS REFERENCE TO RELATED APPLICATIONS

This application claims the benefit of priority to British Patent Application GB1615743.0 filed on Sep. 15, 2016, and the entire contents of this application are hereby incorporated herein by reference.

BACKGROUND OF THE INVENTION

1. Field of the Invention

The present invention relates to an embedded DC-DC converter device, and in particular to a DC-DC converter device with improved power efficiency.

2. Description of the Related Art

It is known, for example in U.S. 2011/0108317 A1, to provide low profile transformers and inductors in which the magnetic components are embedded in a cavity in a resin substrate, and the necessary input and output electrical connections for the transformer or inductor are formed on the substrate surface. A printed circuit board (PCB) for a power supply device can then be formed by adding layers of solder resist and copper plating to the top and/or bottom surfaces of the substrate. The necessary electronic components for the converter device may then be surface mounted on the PCB.

Compared to conventional converters, an embedded design allows a significantly thinner and more compact device to be built. This is desirable because typically the space available for mounting the converter device onto a PCB, for example, a motherboard of an electronic device, will be very limited. A converter device including a transformer component with a smaller footprint therefore enables more components to be mounted onto the PCB, or enables the overall size of the PCB and therefore the overall size of the entire converter device to be reduced.

Embedded DC-DC converter devices can be configured as push-pull converters. One such device is discussed in U.S. 2016/111965, in the name of the present applicant, and the entire contents of which are herein incorporated by reference. Converters of this kind are incorporated in the applicant's NXE1 line of products. The device in U.S. 2016/111965 is described for use in Royer circuit configurations (known as self-oscillating push-pull circuits), which rely on saturation of the magnetic core in order to operate. Such a device is described in more detail below in connection with FIG. 5.

There are, however, practical limitations on the size to which a typical transformer can be reduced. Reducing the size of the transformer's magnetic core, for example, results in the core becoming saturated more quickly, leading to operational losses in the transfer of electrical power from the primary winding to the second winding.

Increasing the operational frequency of the core reduces the time the core spends in saturation. However, increasing the operational frequency of the transformer leads to significant losses due to eddy current losses and hysteresis losses. Additionally, prior art converters, such as U.S. 2016/111965, have a limited operational frequency due to the electrical reactance of its components.

The inventors of the invention described and claimed in the present application discovered that it would be desirable to provide a miniaturized DC-DC converter device which requires less input power by having reduced loss at high operating frequency, and to provide a method for manufacturing such a device.

SUMMARY OF THE INVENTION

Preferred embodiments of the present invention provide miniaturized DC-DC converter devices that require less input power by having significantly reduced loss at a high operating frequency, and provide methods for manufacturing such devices.

According to a preferred embodiment of the present invention, a DC-DC converter is provided with an insulating substrate; a magnetic core embedded in the insulating substrate, the magnetic core having non-zero dimensions of less than about 5.4 mm by about 5.4 mm by about 1.8 mm; separate primary and secondary transformer windings surrounding first and second regions of the magnetic core; a control circuit including: an oscillator; a drive circuit coupled to the oscillator; one or more switches coupled to the drive circuit; the drive circuit providing a switching signal to control the one or more switches and energizing the one or more switches to provide a drive voltage to the primary transformer winding; wherein the one or more switches may be transistors implemented in a Silicon-on-Insulator configuration or as a Silicon-on-Sapphire configuration.

The switching signal driving the switches may have, for example, a frequency of at least about 1 MHz, and preferably between about 1 MHz and about 10 MHz.

The power supply unit supplying power to the control circuit and transformer may have a power consumption rating at full load of about 1.5 W or less.

Each of the primary and second transformer windings may include, for example, an embedded conductive coil surrounding a region of the magnetic core, wherein the conductive coil includes a plurality of conductive vias passing through the insulating substrate adjacent to or in a vicinity of the magnetic core, and a plurality of conductive traces connecting adjacent or neighboring conductive vias, the conductive vias and the conductive traces defining a coil configuration.

The insulating substrate may have, for example, first and second main surfaces opposing each other and the plurality of conductive traces are provided on the first and second main surfaces, respectively.

The capacitor connected between a ground terminal and an input terminal of the oscillator may tune the oscillation frequency of the oscillator according to the capacitance of the capacitor, for example.

The capacitor may be connected to the input terminal of the oscillator and no other electrical components may be connected, for example.

The primary transformer winding may include less than five turns, for example.

The above and other elements, features, steps, characteristics and advantages of the present invention will become more apparent from the following detailed description of preferred embodiments with reference to the attached drawings.

BRIEF DESCRIPTION OF THE DRAWINGS

FIGS. 1A to 1G show an example technique for manufacturing the embedded magnetic core of a DC-DC converter device.

DETAILED DESCRIPTION OF THE PREFERRED EMBODIMENTS

Hereinafter, the present invention will be clarified through description of specific preferred embodiments of the present invention with reference to the drawings.

It is to be noted that the preferred embodiments described in this specification are merely examples, and that the configurations in the preferred embodiments are able to be partly replaced or combined between different preferred embodiments.

Preferred embodiments of the present invention include an embedded converter device with first and second transformer windings disposed around a magnetic core embedded in a substrate. The converter device may be used as a portion of switching power electronic devices, for example. The device is described with respect to preferred embodiments of the present invention shown in FIGS. 2 to 4, which will be discussed in detail below.

For ease of understanding, an example of a method of manufacturing a converter device will now be described with reference to FIGS. 1A to 1G. Techniques for manufacturing a converter device are described in U.S. 2016/049235 (A1) and U.S. 2016/049236 (A1), filed by the present applicant, the entire contents of which are incorporated herein by reference.

Figure 1A:
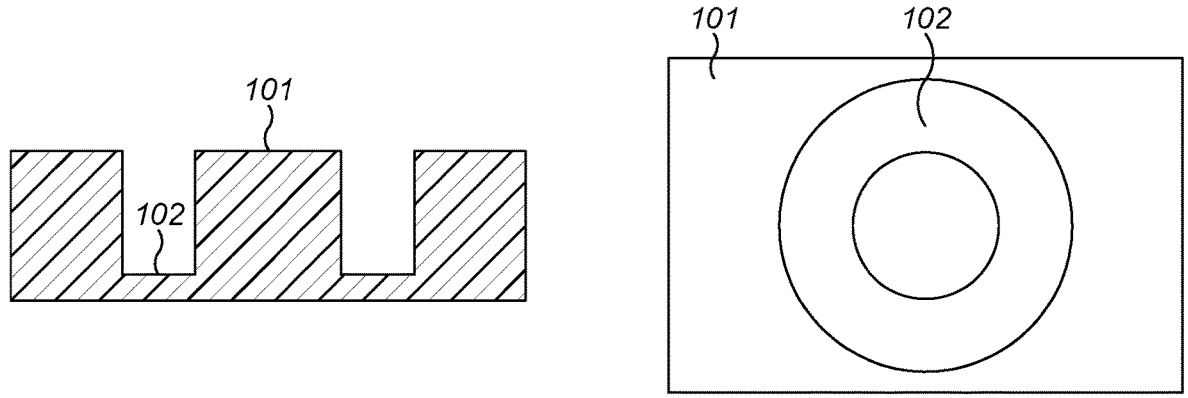

In a first step of the method, shown in FIG. 1A, a circular annulus or cavity 102 for housing a magnetic core is routed in an insulating substrate 101. In this example, the insulating substrate is formed of a resin material, such as FR4. FR4 is a composite 'pre-preg' material composed of woven fiberglass cloth impregnated with an epoxy resin binder. The resin is pre-dried, but not hardened, so that when it is heated, it flows and acts as an adhesive for the fiberglass material. FR4 has been found to have favorable thermal and insulation properties.

Figure 1B:
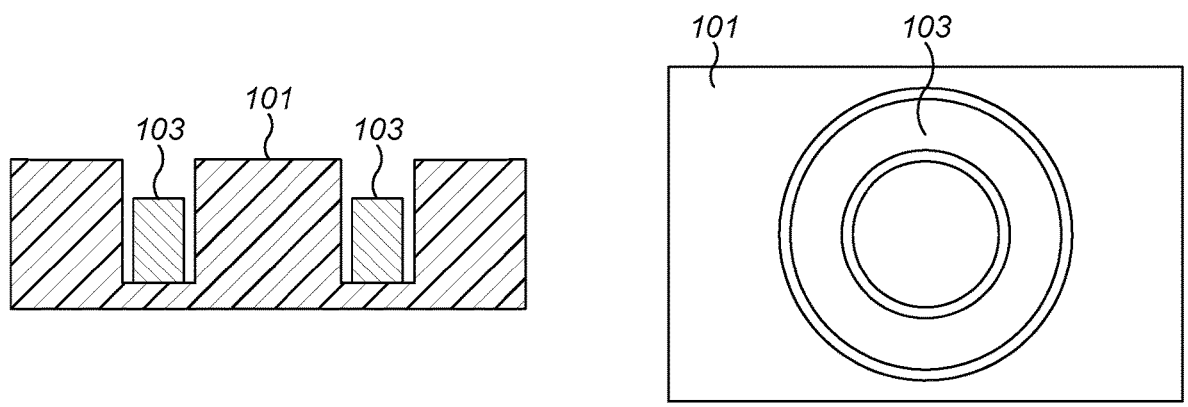
Figure 1C:
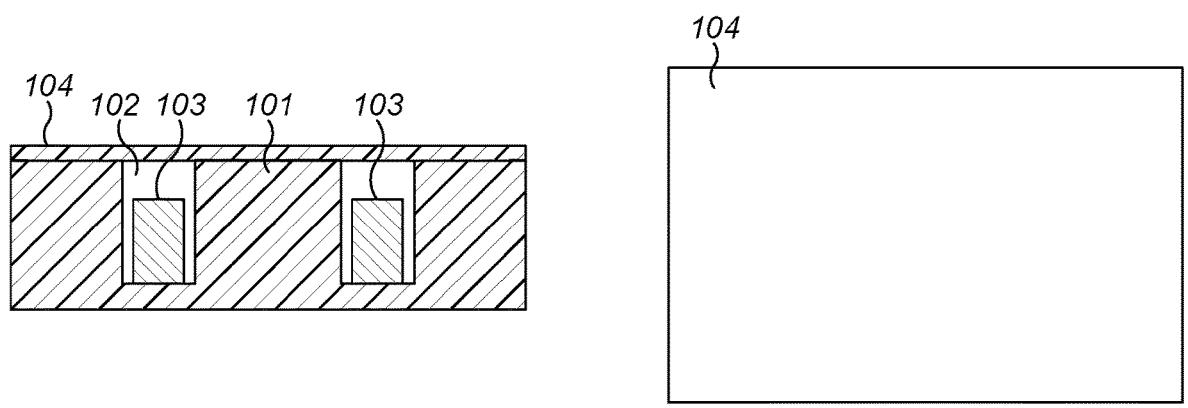

As shown in FIG. 1B, a circular magnetic core 103 is then installed in the cavity 102. The cavity 102 may be slightly larger than the magnetic core 103, so that an air gap may exist around the magnetic core 103. The magnetic core 103 may be installed in the cavity manually or by a surface mounting device such as a pick and place machine.

In the next step, shown in FIG. 10, a first insulating layer 104 or cover layer is secured or laminated on the insulating substrate 101 to cover the cavity 102 and magnetic core 103. Preferably, the cover layer 104 is formed of the same material as the insulating substrate 101 as this aids bonding between the top surface of the insulating substrate 101 and the lower surface of the cover layer 104. The cover layer 104 may therefore also be formed of a material such as FR4, laminated onto the insulating substrate 101. Lamination may be via adhesive or via heat activated bonding between layers of pre-preg material. However, other materials may be used for the layer 104.

In the next step shown in FIG. 1D, through-holes 105 are formed through the insulating substrate 101 and the cover layer 104. The through holes 105 are formed at suitable locations to form the first and second coil conductor windings of an embedded transformer. The exact arrangement of the through-holes will be described later, but a general pattern of through-holes including two arcs corresponding to the inner and outer circular circumferences of the cavity 102 is shown in FIG. 1D. As is known in the art, the through-holes 105 may be formed by drilling, or any other suitable technique.

As shown in FIG. 1E, the through-holes 105 are then plated up to form conductive via holes 106 that extend from the top surface of the cover layer to the bottom surface of the substrate 101. Conductive or metallic traces 107 are added to the top surface of the cover layer 104 to form an upper winding layer connecting the respective conductive via holes 106, and a portion forming the windings of the transformer. The upper winding layer is shown by way of example in the right hand side of FIG. 1E. The metallic traces 107 and the plating for the conductive vias are usually formed from copper, and may be formed in any suitable way, such as by adding a copper conductor layer to the outer surfaces of the layer 104 which is then etched to form the patterns, deposition of the copper onto the surface, and so on.

Metallic traces 107 are also formed on the bottom surface of the insulating substrate 101 to define a lower winding layer and also to connect the respective conductive via holes 106 to define the windings of the transformer. The upper and lower winding layers and the via holes 106 together define the windings of the transformer. In FIG. 1E, only first and second side windings are shown.

Figure 1G:
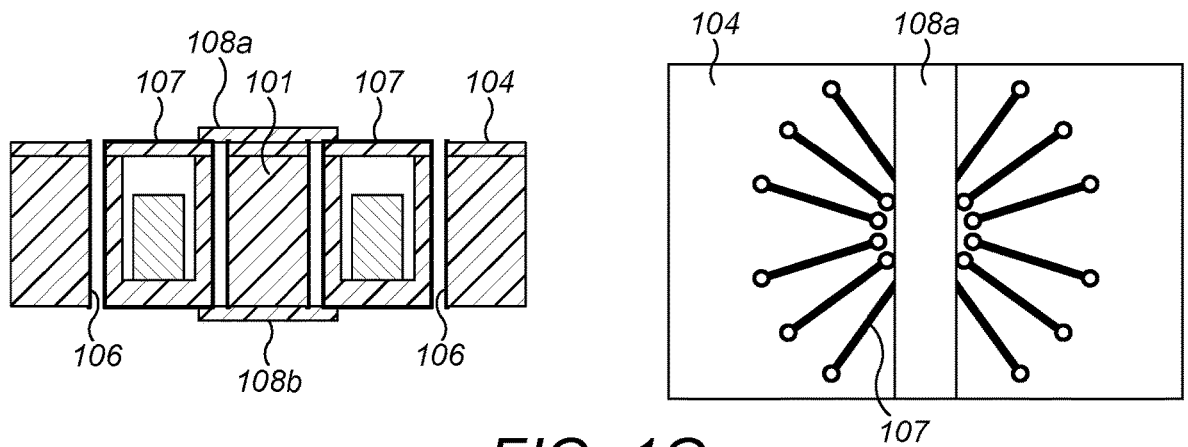

As shown in FIGS. 1F and 1G, optional second and third further insulating layers 108 may be formed on the top and bottom surfaces of the structure shown in FIG. 1E to define first and second isolation barriers. The layers may be secured in place by lamination or any other suitable technique.

In FIG. 1F, the bottom surface of the second insulating layer or first isolation barrier 108a adheres to the top surface of the cover layer 104 and covers the terminal lines 107 of the upper winding layer. The top surface of the third insulating layer or second isolation barrier 108b adheres to the bottom surface of the substrate 101 and covers the terminal lines 107 of the lower winding layer. The second and third layers may also be formed of FR4, for example, and laminated onto the insulating substrate 101 and cover layer 104 using the same process as for the cover layer 104.

Through-holes and via conductors are formed through the second and third insulating layers to connect to the input and output terminals of the first and second transformer windings (not shown). Where the vias through the second and third insulating layers are located apart from the vias through the substrate and the cover layer 104, a metallic trace is included on the upper winding layer to connect the input and output vias to the first and last via in each of the first and second windings. Where the input and output vias are formed in overlapping positions, then conductive or metallic caps could be added to the first and last via in each of the first and second windings.

In FIG. 1F, the first and second isolation barriers 108a and 108b form a solid bonded joint with the adjacent or neighboring layers, either layer 104 or substrate 101, on which the upper or lower winding layers of the transformer are formed. The first and second isolation barriers 108a and 108b therefore provide a solid insulated boundary along the surfaces of the converter device, significantly reducing or preventing arcing or breakdown, and allowing the isolation spacing between the first and second side windings to be significantly reduced.

The first and second isolation barriers 108a and 108b are formed on the substrate 101 and cover layer 104 without any air gap between the layers. It will be appreciated that if there is an air gap in the device, such as above or below the winding layers, such an air gap would be a risk of arcing and failure of the device. The first and second isolation barriers 108a and 108b, the cover layer 104 and the substrate 101, therefore form a solid or substantially solid block of insulating material.

In FIG. 1F, the first and second isolation barriers 108a and 108b are shown as covering the whole of the cover layer 104 and the bottom surface of the substrate 101 of the converter device 100. In an alternative example shown in FIG. 1G, however, it is sufficient if the first and second isolation barriers are applied to the cover layer 104 and the bottom of the substrate 101 so that they at least cover only the portion of the surface of the cover layer 104 and substrate 101 surface between the first and second windings, where the first and second windings are closest. As shown in FIG. 1G, the first and second isolation barriers 108a and 108b may then be provided as a long strip of insulating material placed on the surface parallel or substantially parallel to the shorter edge of the device and covering at least an isolation region between the first and second side windings, for example. In other alternative examples, as the first and second side windings follow the arc of the magnetic core 103 around which they are wound, the isolation barriers 108a and 108b may be placed only where the first and second side windings are closest, which in this case is at the 12 o'clock and 6 o'clock positions, for example. As noted above, however, a full layer of 108a and 108b covering the entire surface of the embedded component device provides locations for further mounting of components on the surface of the device.

A first preferred embodiment of a converter device according to the present invention will now be described with reference to FIG. 2. Such a converter device may be constructed according to the steps described above in relation to FIGS. 1A to 1F.

Figure 2:
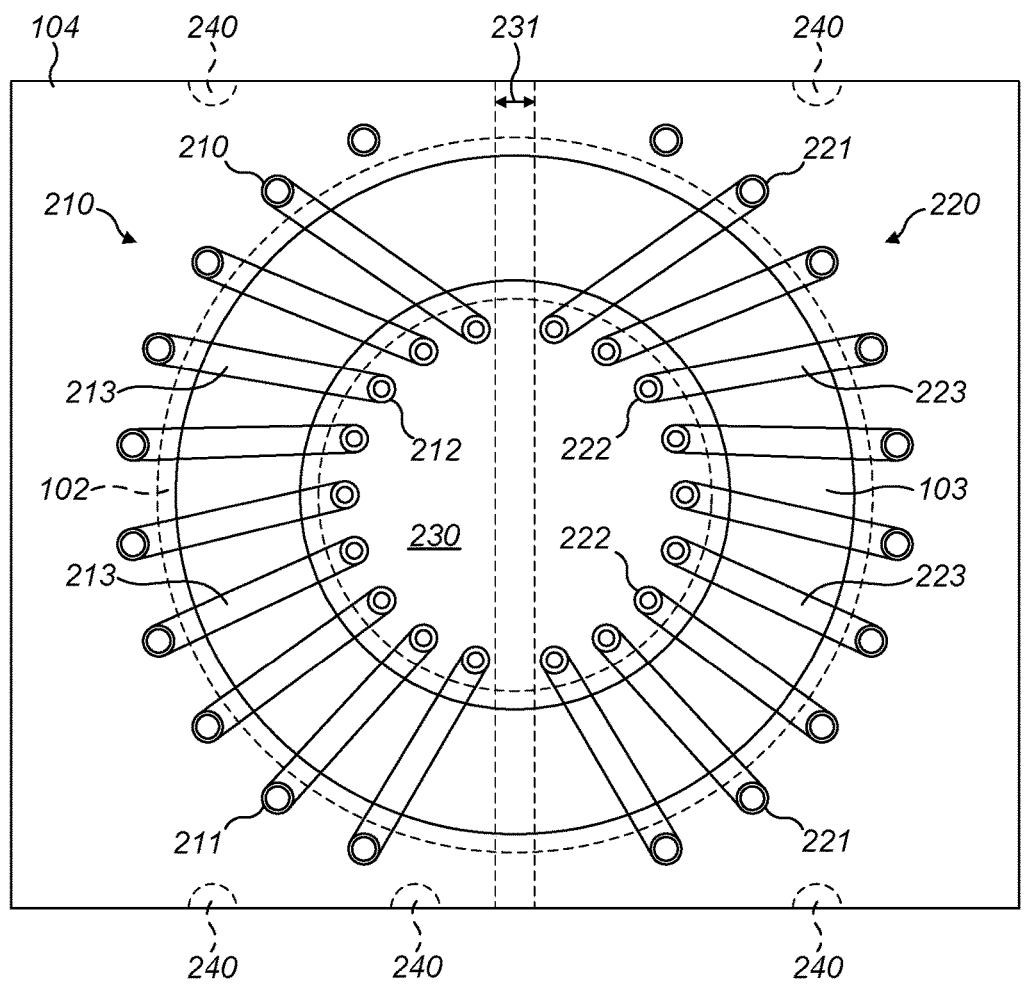
FIG. 2 shows a first preferred embodiment of the present invention in a top down view of the conductive vias defining a winding construction.

As shown in FIG. 2, the converter device includes a first winding 210 and a second winding 220. These windings are disposed around a common magnetic transformer core 103 provided in the cavity 102. As shown in FIG. 2, the windings 210 and 220 are separate from one another and occupy discrete areas of the substrate. The transformer windings do not overlap with one another. The central island defined by the cavity 102 may be referred to as the isolation region because it is designed to provide some isolation between the first and second sides of the transformer.

Figure 3:
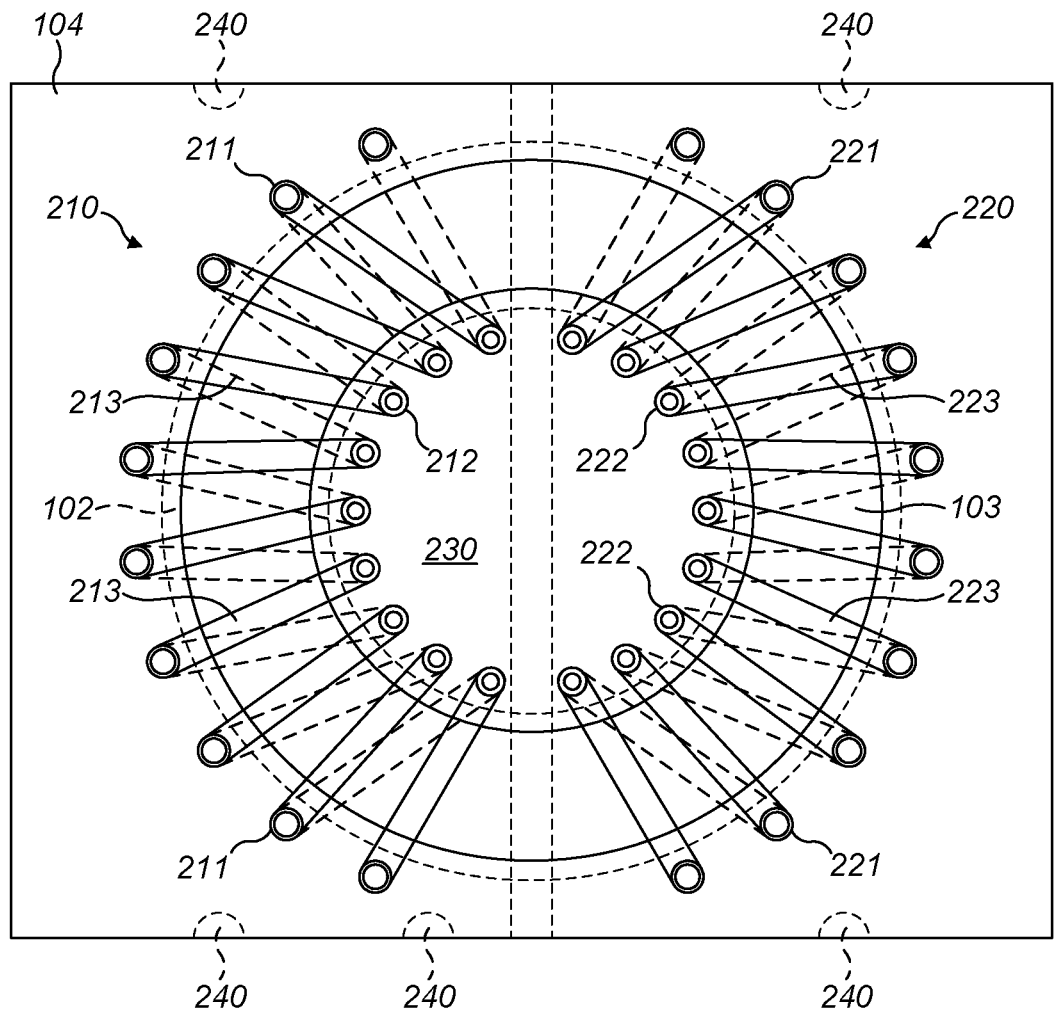
FIG. 3 shows the trace pattern for the arrangement of conductive vias in FIG. 2 to form the windings.

The first and second windings of the transformer are defined by upper and lower conductive traces located on the top and bottom of the resin substrate (not visible in FIG. 2), connected by a plurality of respective conductive connectors passing through the substrate from one side to the other. The conductive connectors may be defined by plated via holes as described above, or may be conductive pins or filaments. In FIGS. 2 and 3, the conductive connectors are shown as plated vias, for example.

The arrangement of the via holes defining the first and second windings is important because the spacing between the via holes themselves, together with the spacing between the via holes and the magnetic core, affects both the electrical isolation obtainable between the transformer windings, and the degree of coupling between the transformer windings.

In practice, the size of the converter device limits the extent of the spacing available between the via holes. Nevertheless, it is often desirable to maximize or significantly increase the spacing between the vias because this leads to better isolation performance. Large spacings also tend to increase the leakage inductance of the transformer, thus weakly coupling the windings together. This is often desirable for the reasons explained below. The via hole spacing according to the present preferred embodiment therefore provides improvements in the isolation characteristics and leakage inductance of the windings, whilst still allowing a compact converter device to be realized.

The structure of the separate windings will now be described in more detail.

The first winding of the transformer 210 includes first outer conductive vias 211, first inner conductive vias 212, and upper and lower conductive traces linking the conductive vias 213. The first outer conductive vias 211 are preferably arranged in one row along the circular portion of the outer edge of the cavity 102. The first inner conductive vias 212 are also arranged in one row 212 along the inner edge of the cavity 102.

As will be understood by one skilled in the art, the first transformer winding may have the same number of inner and outer conductive vias of the complete first winding. This ensures that the terminals at either end of the first winding are on the same side, for example, on top of the cover layer 104 or on the bottom of the insulating layer. Alternatively, it is also possible to provide the first winding with an arrangement where there is one more inner conductive via than there are outer conductive vias, or where there is one fewer inner conductive vias than there are outer conductive vias. Such an arrangement means that the terminals at either end of the first winding are on opposing sides, with one on top of the cover 104 and one on the bottom of the insulating layer. Both of these alternatives, where the terminals are on the same or opposing sides, may be desirable depending on the location of the input and output circuitry to which the terminals are to be connected. The second windings may also be similarly arranged.

As shown in FIG. 2, each outer conductive via 211 in the upper winding layer is connected to a single inner conductive via 212 by a metallic trace 213. The metallic traces 213 are provided on the surface of the cover layer 104 and do not overlap with one another. Although, the inner conductive vias 212 need not strictly be arranged in rows, it is helpful to do so, as an ordered arrangement of the inner conductive vias 212 assists in arranging the metallic traces 213 so that they connect the outer conductive vias 211 to the inner conductive vias 212.

The second winding of the transformer 220 includes second outer conductive vias 221, second inner conductive vias 222, and conductive traces 223 linking the conductive vias. The second outer conductive vias 221 are arranged in a single row along the circular portion of the cavity 102. The second inner conductive vias 222 are also arranged in a single row.

As will be understood by one skilled in the art, when the transformer is in operation, the ratio of the voltages provided across the first and second windings is proportional to the number of turns in each respective winding. Therefore, the number of turns in each winding can be chosen, by adding or removing conductive vias and conductive traces, to obtain desirable voltage ratios between the windings. This is particularly desirable in, for example, isolated DC to DC converters where strict requirements as to the output voltage are often desired.

Optional terminations 240 provided in the substrate of the converter device are also shown. These may take the form of edge castellations providing for Surface Mount Application (SMA) connections from the converter device to a printed circuit board on which the converter device may be mounted. The cover layer 104 is arranged so as not to cover these terminations, to allow them to be connected to other electrical components.

As explained above, the spacing between adjacent or neighboring conductive vias and the spacing between the via holes and the magnetic core has implications for the electrical isolation between the transformer windings and the amount of leakage inductance present in the converter device. At the same time, it is desirable to provide a converter device with a small footprint, thus limiting the extent to which these spacings can be increased. In FIG. 2, the central region of the substrate, the region circumscribed by the inner wall of the cavity 102, defines an isolation region 230 between the primary and the secondary windings. The minimum preferred distance between the inner conductive vias 212 and 222 of the primary and secondary windings 210 and 220 is the isolation distance, and is shown in FIG. 2 by arrow 231.

FIG. 3 shows complete first 210 and second 220 windings provided by linking the conductive vias together by conductive traces 213 and 223. The conductive traces 213 and 223 shown with a solid outline are the upper conductive traces and are provided on the first side of the insulating substrate, whereas the conductive traces 213 and 223 shown with a dashed outline are the lower conductive traces and are provided on the second side of the insulating substrate. The first winding 210 therefore includes first outer conductive vias 211 connected by the conductive traces 213 to the first inner conductive vias 212. Similarly, the second winding 220 includes second outer conductive vias 221 connected by the conductive traces 223 to the second inner conductive vias 222.

In FIG. 3, connections to the first 210 and second 220 windings, respectively, may be made by traces on the top and bottom of the substrate (not shown) connecting to the respective vias, for example. Further conductive vias can be provided through the insulating substrate to link these conductive regions from one side of the insulating substrate to the other, for example. Note that to improve the clarity and legibility of FIGS. 2 and 3, not all of the conductive vias are labelled.

In other preferred embodiments of the present invention, the shape of the insulating substrate may vary, for example. However, the shape of the insulating material does not significantly affect the performance of the transformer, which is primarily determined by the position and number of conductive vias in each of the transformer windings.

Figure 4:
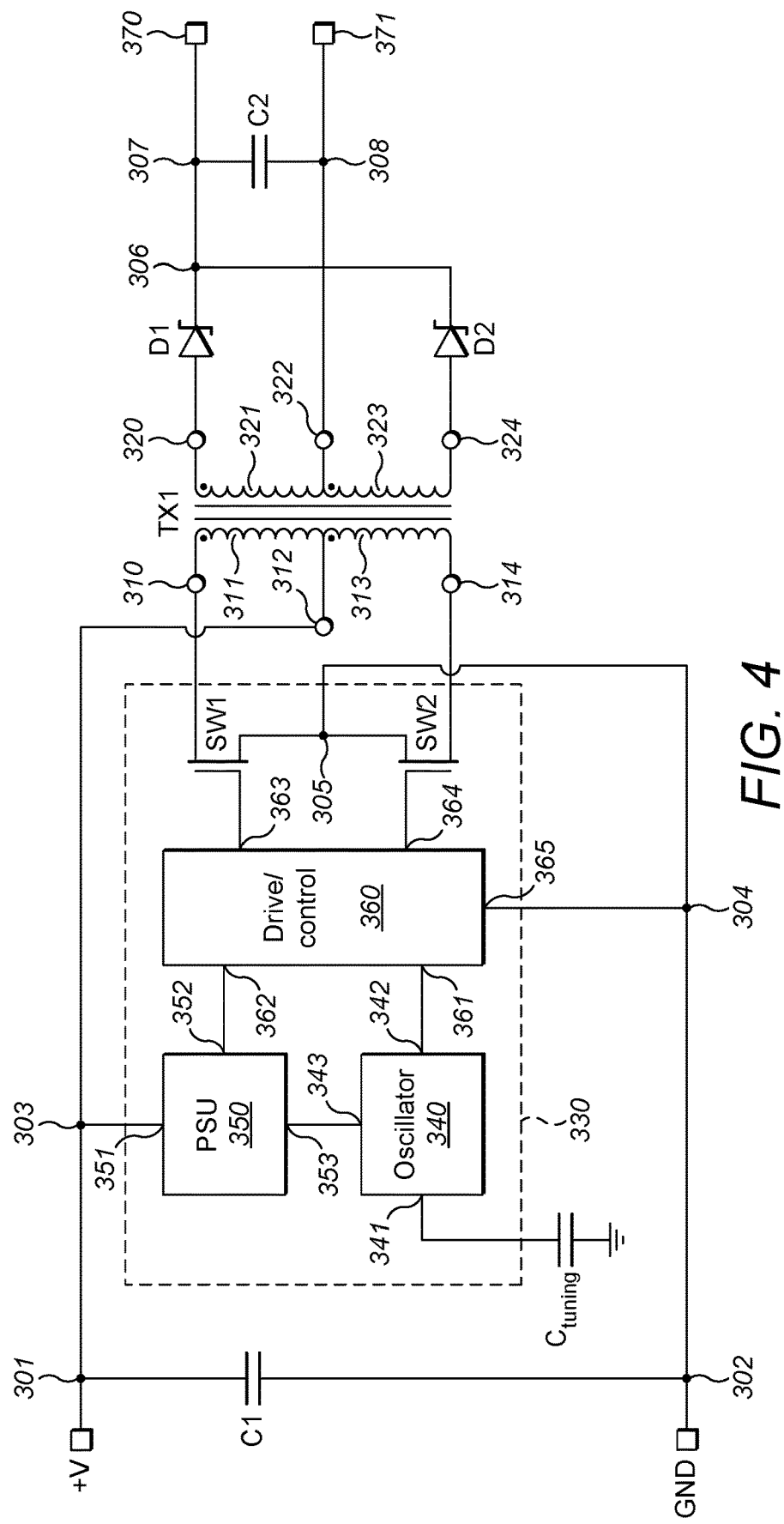
FIG. 4 shows a preferred embodiment of the present invention where the converter device defines a portion of a switch controlled push-pull converter circuit.

FIG. 4 shows a circuit diagram of a push-pull converter using the converter device of FIGS. 2 and 3 as its transformer element TX1. The circuit takes a DC input between input terminals +V and GND, with the GND terminal being held at ground potential. A capacitor C1 is connected in series between input terminals +V and GND via nodes 301 and 302.

The transformer TX1, preferably structured to define an embedded transformer described in FIGS. 2 and 3, includes a first winding defined between nodes 310 and 314 and a second winding defined between nodes 320 and 324. Node 312 is partially connected along the first winding, and node 322 is partially connected along the second winding. In one example, the nodes 312, 322 partially connected along the windings are connected to the midpoint of the respective windings. Thus, the first winding is divided into two windings 311 and 313, and the second winding is divided into two windings 321 and 323.

A control circuit 330 is provided to alternately energize the two portions of the first winding 311 and 313. The control circuit 330 is connected to the input terminals +V and GND by nodes 303 and 304, respectively. The control circuit 330 includes two switches SW1 and SW2 to switch in and out an energizing voltage across the two portions of the first windings 313 and 311, respectively. In one preferred embodiment of the present invention, and as shown in FIG. 4, the switches SW1, SW2 each include a transistor, preferably a FET implemented in Silicon-on-Insulator (SOI) or Silicon-on-Sapphire (SOS) technology.

Silicon-on-Insulator technology and Silicon-on-Sapphire technology are known and described in more detail in U.S. Pat. Nos. 4,177,084, 4,509,990, and 4,659,392 and the paper entitled "High-Quality CMOS in Thin (100 nm) Silicon on Sapphire" by G. A Garcia et al., the entire contents of which are hereby incorporated by reference.

In one preferred embodiment of the present invention, the SOI- or SOS-implemented FETs are provided in the control circuit 330, which is then mounted onto a PCB substrate.

The drain of FET switch SW1 is connected to a first end of the first winding at node 310, and the drain of FET switch SW2 is connected to a second end of the first winding at node 314. The source of FET switch SW1 and the source of FET switch SW2 are coupled at node 305 and connected to node 304, which is held at ground potential. Node 312 is connected directly to the high voltage input +V.

The control circuit 330 further includes oscillator circuitry 340, a power supply unit 350 and drive/control circuitry 360. A capacitor $C_{tuning}$ is connected between input 341 of the oscillator circuitry 340 and ground, to tune the operational frequency of the oscillator according to its capacitance. As shown in FIG. 4, the tuning capacitor is mounted outside the control circuit 330. This is to ensure that a larger tuning capacitor, with a higher capacitance, does not inhibit minimizing or significantly reducing the control circuitry. In an alternative preferred embodiment of the present invention, capacitor $C_{tuning}$ may be replaced by a general impedance Z1, for example.

Oscillator output 342 is connected to an input 361 of drive/control circuitry 360. An output 353 of the power supply unit (PSU) 350 provides a supply voltage to the oscillator at input 343. The PSU includes an input 351 connected to the input terminal +V via node 303. An output 352 of the PSU provides a supply voltage to an input 362 of the drive/control circuit 360. The drive/control circuitry 360 creates control signals using the outputs from the PSU and oscillator circuitry. A first switch control signal is sent from output 363 to the gate of FET switch SW1 and a second switch control signal is sent from output 364 to the gate of FET switch SW2. The drive/control circuitry 360 includes a port 365 connected to ground via node 304.

Further control circuits may provide inputs to the drive/control circuitry and PSU, such as over-current protection circuitry and over-temperature protection circuitry, for example. In other preferred embodiments of the present invention, the drive/control may be able to provide control signals to the oscillator circuitry, for example.

The switch control signals produced by the drive/control circuitry may be square or sinusoidal waves, for example, to allow FET switches SW1 and SW2 to each operate with a 50% duty cycle. The switch control signals are provided to FET switches SW1 and SW2 with a 180° phase difference, allowing SW2 to be turned on when SW1 is turned off and vice versa. This enable FET switches SW1 and SW2 to alternate between energizing the winding 311 and energizing the winding 313.

When a winding is energized, the increasing magnetic flux passing through the core of transformer TX1 induces a voltage across the second winding 220. An induced current will flow through the second winding until the transformer core saturates. At this point, the rate of change of magnetic flux within it drops to zero. The voltage across the first winding 210, and therefore the current flowing through it, also drops to zero.

On the output side of the transformer TX1, a diode D1 includes one terminal connected to node 320 and another terminal connected to node 306, and is biased in a direction towards the node 306. A diode D2 is also provided, including one terminal connected to node 324 and another terminal connected to node 306, and again is biased in a direction towards the node 306. Node 322 is directly connected to node 308, and node 306 is directly connected to node 307. A capacitor C2 is provided between the nodes 307 and 308. Node 307 is connected to first output terminal 370, and node 308 is connected to second output terminal 371.

As described above, the second windings 321 and 323 have voltages induced across them according to the rate of change of magnetic flux within the transformer core. Thus, an alternating current through the combined windings 311 and 313 establishes an induced alternating current through the combined windings 321 and 323. When this current circulates in a first direction, diode D1 is forward biased and current flows into node 322, through winding 321, and out of node 320, and a voltage is set up across the output terminals 370 and 371. Diode D2 is reverse biased so no current is able to flow through winding 323. When the alternating current circulates in a second direction, diode D2 is forward biased and current flows into node 322, through winding 323, and out of node 324, thus again applying a voltage of the same polarity across the output terminals 370 and 371. The diodes D1 and D2 thus rectify the alternating current, and the capacitor C2 smooths the output to provide an approximately constant direct current between the output terminals 370 and 371. The circuit shown in FIG. 4 is therefore an isolated DC to DC converter, taking a DC input across terminals +V and GND, and generating a DC output across terminals 370 and 371. As will be understood by one skilled in the art, the voltage of the DC output relative to that of the DC input can be adjusted by varying the number of turns on the first 311, 313 and second 321, 323 windings.

Figure 5:
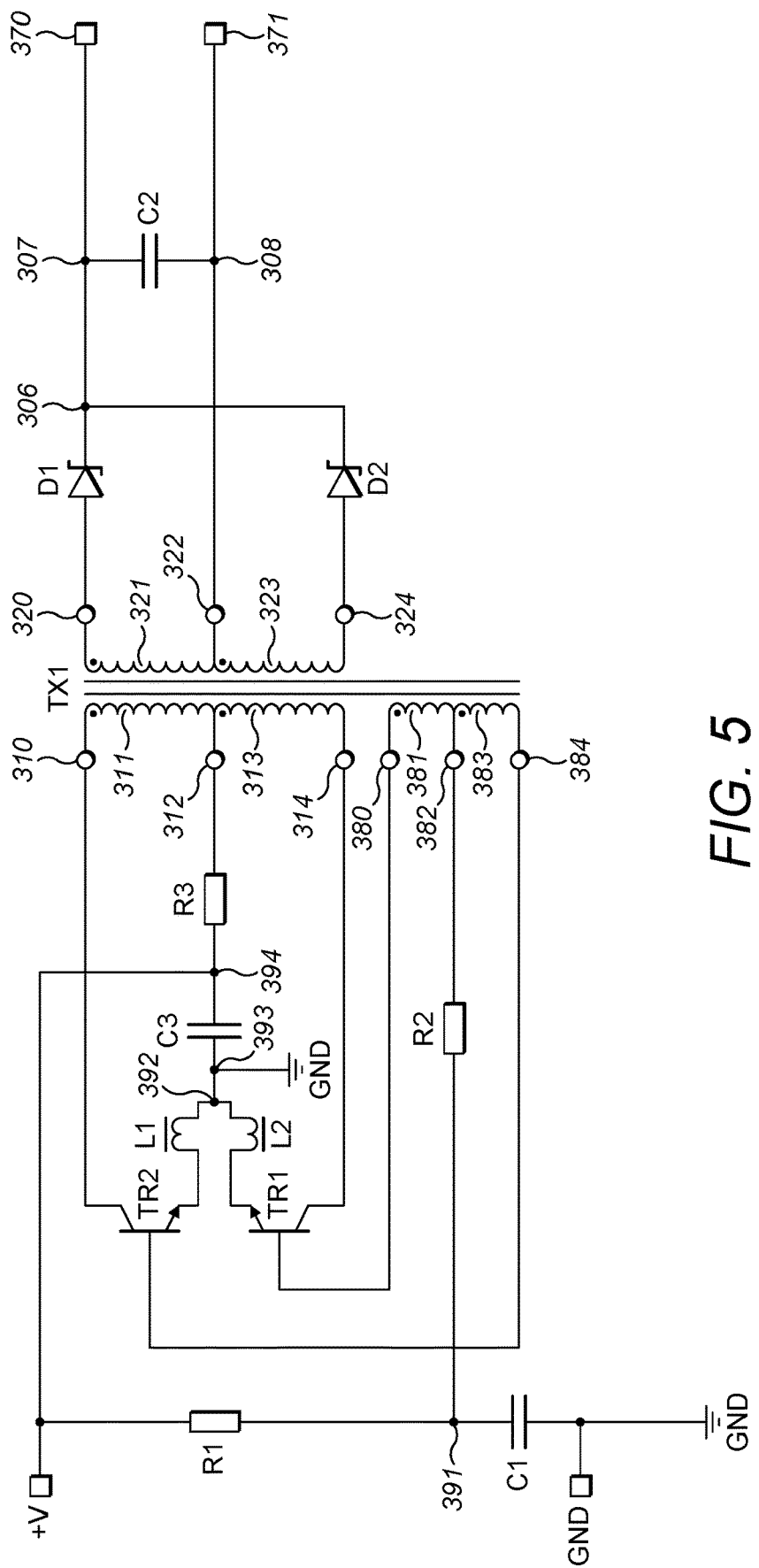
FIG. 5 shows a comparative example where the converter device forms a portion of a self-oscillating push-pull converter circuit.

FIG. 5 shows a comparative example of the device described earlier in connection with U.S. 2016/111965 (A1). As noted above, the comparative example of FIG. 5 corresponds to a push-pull converter in a Royer circuit configuration that may be implemented using the applicant's NXE1 line of products.

The features shown in FIG. 5 that are similar to features included in FIG. 4 have been given the same numbering as previously recited. The transformer TX1 shown in FIG. 5 is formed from an embedded transformer and further includes an auxiliary winding defined between nodes 380 and 384. Each end of the auxiliary winding is connected to one of the bases of the transistors. Thus, node 380 is connected to the base of transistor TR1, and node 384 is connected to the base of transistor TR2. The transistors TR1 and TR2 may be of npn-type but other types are possible, for example.

Node 382 is connected to the first terminal of resistor R2, the second terminal of resistor R2 being connected to node 391. The collector of transistor TR1 is connected to a first end of the first winding at node 310, and the collector of transistor TR2 is connected to a second end of the first winding at node 314. The emitter of transistor TR1 is connected to one terminal of inductor L2, and another terminal of inductor L2 is connected to node 392. The emitter of transistor TR2 is connected to one terminal of inductor L1, and another terminal of inductor L1 is connected to node 392. Node 392 is connected to node 393, which is held at ground potential. A first terminal of capacitor C2 is connected to node 393, and another terminal is connected to node 394 which is connected directly to the high voltage input +V. Between node 394 and node 312, a resistor R3 is provided.

When winding 313 is energized, the increasing magnetic flux passing through the core of transformer TX1 induces a voltage across the auxiliary windings 381 and 383. The induced voltage across auxiliary winding 381 is of the correct polarity to apply a voltage to the base terminal of transistor TR1 to keep transistor TR1 switched on. A positive feedback arrangement is thereby achieved, with TR1 being switched on and TR2 being switched off. Eventually the magnetic field within the core saturates and the rate of change of magnetic flux within it drops to zero. The voltage across the first winding 313, and therefore the current flowing through it, also drops to zero. The auxiliary windings 381 and 383 react to this change and an induced voltage, of reverse polarity, is set up across them. This has the effect of switching on transistor TR2 and switching off transistor TR1, thereby energizing the winding 311. Again, positive feedback is set up and the voltage applied to the base of transistor TR2 by the auxiliary winding 383 maintains transistor TR2 in a switched on state, whilst keeping transistor TR1 in a switched off state. Following this, the magnetic field within the core saturates and the circuit returns to energizing the winding 313. This oscillatory behavior, alternating between energizing the first windings 311 and 313, continues indefinitely as long as input power is provided.

The comparative example of FIG. 5 relies on the magnetic core becoming saturated for a portion of its operating cycle to enable the auxiliary winding to switch between transformers TR1 and TR2. During this time, energy provided at the input side is wasted by not being transferred to outputs 370 and 371. This inefficiency is addressed by the preferred embodiments of the present invention by using the control circuit 330 shown in FIG. 4 to drive the operation of FETs SW1 and SW2 without relying on core saturation. At an optimal or preferred frequency range, the control circuit 330 significantly reduces or prevents saturation of the core for a significant fraction of its operating cycle while still allowing energy to be transferred to the second winding.

By providing the control circuit 330 in the preferred embodiments of FIGS. 2 to 4, there is also no longer a need to provide the auxiliary windings 381 and 383 to feedback a control signal to the transistors TR1 and TR2. As a result, fewer windings are needed around the magnetic core and the device can be made significantly smaller as a result. In one preferred embodiment of the present invention, the significantly reduced size transformer may include less than five turns on the primary winding, for example.

As noted above, in the preferred embodiments of FIGS. 2 to 4, SW1 and SW2 preferably include respective Field Effect Transistors (FET) provided in a thin layer of silicon provided on an insulating substrate (Silicon-on-Insulator technology), or more preferably on an insulating substrate of Sapphire (Silicon-on-Sapphire technology).

Operating at high frequencies generally results in increased losses in the magnetic core due to the increasing influence of eddy current losses and hysteresis losses, as well as to switching losses in the transistors. In the present preferred embodiment, the provision of FETs SW1 and SW2 implemented using Silicon-on-Insulator technology results in the switches SW1 and SW2 being able to operate at much higher frequencies than switches implemented by other fabrication technologies.

The preferred embodiments of FIGS. 2 to 4, for example, are able to operate at much higher frequencies than the operational frequency range of the comparative example shown in FIG. 5. Switching frequencies of up to about 1 MHz are therefore now readily possible, and in a particular preferred embodiment, switching frequencies of about 1 MHz to about 10 MHz are provided, for example.

In the preferred embodiments of the present invention discussed above, the magnetic core may be made out of ferrite. However, at higher frequencies, different materials for the magnetic core may be used to provide suitable inductance characteristics. For example, permalloy materials involving a magnetic alloy of nickel-iron provide a significantly higher magnetic permeability than standard ferrites. Other materials that could be used at frequencies in the MHz range are alloys such as those including NiFe, NiZn Ferrites, CoNiFe, MnZn Ferrites, Granular Film materials such as CoZrO, Composite magnetic materials such as Fe/SiO$_2$ composites.

With appropriate consideration of the materials used for the magnetic core, switching frequencies of up to about 100 MHz may be possible, for example.

Being able to operate at higher frequencies means that the size of the magnetic core can be significantly reduced. The dimensions of the magnetic core in the comparative example of FIG. 5, for example, may be about 8.5 mm×about 5.4 mm×about 1.8 mm, assuming a magnetic core that is an elongated toroid in shape. In this case, about 8.5 mm may be the x-axis dimension corresponding to the long dimension of the elongated toroid, about 5.4 mm may be the y-axis dimension corresponding to the shorter dimension of the elongated toroid, and about 1.8 mm may be the z-axis direction of the elongated toroid, namely its height or thickness. The use of the control circuit and the high switching frequencies made possible by switches SW1 and SW2 means that the dimensions of the magnetic core in the preferred embodiments of FIGS. 2 to 4 can be made smaller than about 8.5 mm×about 5.4 mm×about 1.8 mm, for example. In turn, this allows the overall size of the electronic device housing the transformer to be significantly reduced.

Naturally, the preferred embodiments of the present invention are not limited to magnetic cores of this shape, and other shapes may be used, for example. Assuming a circular magnetic core, dimensions of less than about 5.4 mm×about 5.4 mm×about 1.8 mm would therefore be possible. In one preferred embodiment of the present invention, the size of the magnetic core is preferably in the range of about 3.8 mm×about 3.8 mm by about 0.9 mm, and about 5.4 mm×about 5.4 mm×about 1.8 mm, for example.

Assuming other shapes of magnetic core, it is useful to define a notional boundary shape surrounding the magnetic core wherein the planar surfaces of the boundary shape define appropriate x, y and z directions for specifying the size of the magnetic core. For example, the magnetic core 103 and cavity in which it is housed may be circular, oval, elongated toroidal shape, a toroidal shape having a gap, or even EE, EI, I, EFD, EP, UI and UR core shapes. For EE, EI, I, EFD, EP, UI and UR core shapes, the notional box defined by the boundary shape should include all elements of the magnetic core shape. In this discussion, it will be appreciated that the x and y directions are in the plane in which the transformer magnetic core has a width and a depth, while the z direction is along the height dimension of the transformer magnetic core.

As previously discussed, being able to operate at higher frequencies means that the transformer can operate more efficiently, and leads to fewer switching losses in the converter device. Significantly reducing the losses also enables the power consumption of the miniaturized converter device to be significantly reduced. The output power may therefore be increased for a given input power or, conversely, the amount of input power may be significantly reduced for a required output power.

The preferred embodiments shown in FIGS. 2 to 4 can therefore be implemented in a low power device. The power consumption at full load in the comparative device of FIG. 5, for example, can be taken as about 1.5 W. The device of FIGS. 2 to 4 can however be implemented having a power consumption at full load power of less than about 1.5 W, for example.

Although reference is made to conductive vias throughout the present application, it should be noted that any conductive connecting elements or components, for example, conductive pins, can be used in place of any one or more of the conductive vias. Furthermore, the first and second windings can each either be primary transformer windings being connected to the input power supply of the transformer, or secondary transformer windings being connected to the output of the transformer, for example. The converter device can include either a step-up or step-down transformer and may alternatively be a standard wired transformer, for example.

The magnetic core 103 may be coated with an insulating material to significantly reduce the possibility of breakdown occurring between the conductive magnetic core and the conductive vias or metallic traces, for example. The magnetic core may also have chamfered edges providing a profile or cross section that is rounded, for example.

In the description above, a converter has been described with an equal or substantially equal number of turns on the primary side windings as on the secondary side. In other preferred embodiments of the present invention, different numbers of turns on the primary and secondary side may be used, for example.

Although a single push-pull configuration has been described in the preferred embodiments of the present invention above, other topologies may benefit from the teaching of the patent application, such as a pull-push configuration, for example. Also, in one preferred embodiment of the present invention, a single primary transformer winding using a full-bridge output switch configuration may be used, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A DC-DC converter, comprising:
   an insulating substrate;
   a magnetic core embedded in the insulating substrate, the magnetic core having non-zero dimensions of less than or equal to 5.4 mm by less than or equal to 5.4 mm by less than or equal to 1.8 mm;
   primary and secondary transformer windings separate from each other and surrounding first and second regions of the magnetic core such that that a first boundary around the primary transformer winding does not overlap a second boundary around the secondary transformer winding when viewed from a top down view; and a control circuit including:
an oscillator;
a drive circuit coupled to the oscillator; and
one or more switches coupled to the drive circuit; wherein the drive circuit provides a switching signal to the one or more switches and energizes the one or more switches to provide a drive voltage to the primary transformer winding; and the one or more switches are Field Effect Transistors implemented in a Silicon-on-Insulator configuration or in a Silicon-on-Sapphire configuration.

2. The DC-DC converter of claim 1, wherein the switching signal has a frequency in a range of 1 MHz to 10 MHz.

3. The DC-DC converter of claim 1, further comprising a power supply unit supplying power to the control circuit and the primary transformer winding, the power supply unit having a power consumption rating at full load of 1.5 W or less.

4. The DC-DC converter of claim 1, wherein:
each of the primary and second transformer windings includes an embedded conductive coil surrounding a region of the magnetic core;
the embedded conductive coil includes a plurality of conductive vias passing through the insulating substrate adjacent to or in a vicinity of the magnetic core; and
a plurality of conductive traces connect adjacent or neighboring conductive vias to define a coil.

5. The DC-DC converter of claim 4, wherein:
the insulating substrate includes first and second main surfaces opposing each other; and
the plurality of conductive traces are provided on the first and second main surfaces of the insulating substrate.

6. The DC-DC converter of claim 5, wherein the control circuit is embedded on the first main surface of the insulating substrate.

7. The DC-DC converter of claim 1, further comprising:
a capacitor connected between a ground terminal and an input terminal of the oscillator; wherein
an oscillation frequency of the oscillator is tunable according to a capacitance of the capacitor.

8. The DC-DC converter of claim 7, wherein only the capacitor is connected to the input terminal of the oscillator.

9. The DC-DC converter of claim 7, wherein the capacitor is mounted outside the control circuit.

10. The DC-DC converter of claim 1, wherein the primary transformer winding includes less than five turns.

11. The DC-DC converter of claim 1, wherein the insulating substrate is a resin substrate.

12. The DC-DC converter of claim 1, wherein the converter is a push-pull converter or a pull-push converter.

13. The DC-DC converter of claim 12, wherein:
the one or more switches include first and second switches coupled to the drive circuit; and
the drive circuit provides the switching signal to control the first and second switches, the switching signal energizing the first and second switches alternately to provide an alternating drive voltage to the primary transformer winding.

14. The DC-DC converter of claim 1, wherein the switching signal has a frequency of at least 1 MHz.

* * * * *